US010191100B2

(12) United States Patent
Blank et al.

(10) Patent No.: US 10,191,100 B2
(45) Date of Patent: Jan. 29, 2019

(54) HIGH-POWERED HIGH-VOLTAGE TEST DEVICE WITH INTEGRATED ACTIVE AIR COOLING

(71) Applicant: B2 ELECTRONIC GMBH, Klaus (AT)

(72) Inventors: Rudolf Blank, Sulz (AT); Stefan Baldauf, Rankweil (AT)

(73) Assignee: B2 ELECTRONIC GMBH, Klaus (AT)

( * ) Notice: Subject to any disclaimer, the term of this patent is extended or adjusted under 35 U.S.C. 154(b) by 490 days.

(21) Appl. No.: 14/945,860

(22) Filed: Nov. 19, 2015

(65) Prior Publication Data

US 2016/0069944 A1 Mar. 10, 2016

Related U.S. Application Data

(63) Continuation of application No. PCT/EP2014/001372, filed on May 21, 2014.

(30) Foreign Application Priority Data

May 22, 2013 (DE) ........................ 10 2013 008 611

(51) Int. Cl.
*G01R 31/10* (2006.01)
*G01R 31/02* (2006.01)
(Continued)

(52) U.S. Cl.
CPC ............... *G01R 31/02* (2013.01); *G01R 1/44* (2013.01); *G01R 15/14* (2013.01);
(Continued)

(58) Field of Classification Search
CPC ...... G06F 19/3481; G06F 1/28; G06F 3/0304; G06F 3/0428; G06F 3/04815;
(Continued)

(56) References Cited

U.S. PATENT DOCUMENTS 4,338,561 A * 7/1982 Zaengl .................. G01R 31/14 323/208
9,778,304 B2 * 10/2017 Blank ................ G01R 27/2694
(Continued)

FOREIGN PATENT DOCUMENTS

| | | | |
|---|---|---|---|
| AL | 2014187563 | A1 | 11/2014 |
| DE | 249978 | A1 | 9/1987 |
| DE | 3737373 | C2 | 2/1996 |
| DE | 19513441 | A1 | 10/1996 |
| DE | 19513441 | C5 | 7/2008 |

(Continued)

OTHER PUBLICATIONS

English translation of the International Search Report and the International Preliminary Report on Patentability with Written Opinion, dated Nov. 24, 2015, for corresponding international application PCT/EP2014/001372.

(Continued)

*Primary Examiner* — Vinh Nguyen
(74) *Attorney, Agent, or Firm* — Myers Wolin, LLC

(57) ABSTRACT

A high-powered, high-voltage test device for generating a test voltage, wherein the test voltage is an alternating voltage having an amplitude of at least 100 kV at a power of greater than 1 kW, wherein the device has at least two voltage amplifier branches, of which a first voltage amplifier branch contributes to generating the positive voltage half-cycles of the test voltage and a second voltage amplifier branch contributes to generating the negative voltage half-cycles of the test voltage. The high-voltage test device furthermore has a measurement circuit for measuring the test voltage to be applied to a measurement object and the test current consequently caused in the measurement object and is characterized in that each voltage amplifier branch is installed in a separate assembly having integrated active air cooling.

12 Claims, 3 Drawing Sheets

26 29 30 30 29 27 C C 35 D D 33 33 35 35 28 B B 28 2 35 35 34 32 34 32 A A

(51) Int. Cl.
*G01R 31/12* (2006.01)
*G01R 31/14* (2006.01)
*G01R 1/44* (2006.01)
*G01R 15/14* (2006.01)

(52) U.S. Cl.
CPC ......... *G01R 31/1272* (2013.01); *G01R 31/14* (2013.01); *G01R 31/021* (2013.01)

(58) Field of Classification Search
CPC .... G05B 19/042; G01R 33/032; G01R 15/14; G01R 19/0084; G01R 1/44; G01R 29/085; G01R 29/0878; G01R 31/02; G01R 31/021; G01R 31/2884; G01R 33/0322; G01R 33/26; G01R 31/14; G01K 11/32; G01K 11/3206; H02M 5/453; H02M 7/003; H02M 7/06; H02M 7/493
See application file for complete search history.

(56) References Cited

U.S. PATENT DOCUMENTS

| | | | |
|---|---|---|---|
| 2010/0118491 | A1 | 5/2010 | Blank et al. |
| 2014/0239990 | A1 | 8/2014 | Steiger et al. |

FOREIGN PATENT DOCUMENTS

| | | | |
|---|---|---|---|
| DE | 102007034558 | A1 | 1/2009 |
| EP | 0012721 | A1 | 6/1980 |
| EP | 2590490 | A1 | 5/2013 |
| WO | 2009143543 | A2 | 12/2009 |

OTHER PUBLICATIONS

S.J. Kearley, R.R. Mackinlay, “Discharge measurements in cables using a solid state 30 kV bipolar low frequency generator”, Fifth International Conference on Dielectric Materials, Measurements and Applications, 1988, p. 171-174.

* cited by examiner 1
2
6
26
26'
26''
27
27'
27''
28
29
30
31

27
28
B
35
34
32
A
35
C
29
33
30
D
2
30
D
33
29
G
35
35
34
32
A
B
26
28

HIGH-POWERED HIGH-VOLTAGE TEST DEVICE WITH INTEGRATED ACTIVE AIR COOLING

CROSS REFERENCE TO RELATED APPLICATIONS

This application is a continuation under 35 U.S.C. § 120 of International Application PCT/EP2014/001372, filed May 21, 2014, which claims priority to German Application 10 2013 008 611.6, filed May 22, 2013, the contents of each of which are incorporated by reference herein.

FIELD OF THE INVENTION

The present invention relates to a high-power high-voltage test device comprising means for generating a test voltage with a power of higher than 1 kW, wherein the test voltage is an a.c. voltage with an amplitude of at least 100 kV and wherein the means for generating the test voltage have at least two voltage-amplifier branches, of which a first voltage-amplifier branch is used for or contributes to generating the positive voltage half-waves of the test voltage and a second voltage-amplifier branch is used for or contributes to generating the negative voltage half-waves of the test voltage. Furthermore, a high-power high-voltage test device of the class in question has a measuring circuit for measuring the test voltage to be applied to a measurement object and the test current induced thereby in the measurement object.

BACKGROUND

Such high-voltage test devices are sufficiently known from the prior art and are used for testing of measurement objects, which may be various electrical or electronic components or especially high-voltage or medium-voltage cables. For this purpose the measurement object to be tested is subjected to a usually sinusoidal a.c. voltage (with high amplitude higher than 100 kV) in the said power range and—accompanied by determination and evaluation of the test voltage applied to the measurement object as well as the test current induced thereby—an estimate, for example, is obtained as to whether the tested measurement object has withstood the test voltage for a specified time without voltage breakdown. Furthermore, it is also possible under certain circumstances to determine, for example by successively raising the test voltage, the test voltage from which voltage breakdowns relevant for safety occur or have occurred. Moreover, especially when the high-voltage test device of the class in question is set up to generate a preferably sinusoidal VLF (very low frequency) a.c. voltage with a frequency in the range between 0.01 Hz and 1 Hz, it is possible to determine, while at the same time evaluating the resulting phase shift between test voltage and test current, the so-called loss factor (tan δ) of the measurement object, with which it is possible, in the context of a nondestructive test, to obtain, for example, an estimate of the quality or of the aging condition of the insulation of high-voltage or medium-voltage cables. The measurement and evaluation algorithms to be applied in this respect (and the measurement and evaluation circuits necessary for this purpose) are sufficiently known to the person skilled in the pertinent art.

As explained in the introduction, this test voltage is frequently generated in the prior art by using two voltage-amplifier branches integrated into a high-voltage test device of the class in question, of which one generates the positive voltage half waves and the other the negative voltage half waves of the test voltage, which can then be applied in appropriate alternating manner to the measurement object.

Especially in the case of VLF testing of high-voltage or medium-voltage cables, the requirements for the voltage amplitude and electrical power to be applied by test devices of the class in question become particularly stringent with increasing length of the cable to be tested, and so a great need exists for test devices with correspondingly high power. Furthermore, it is of importance in the scope of the present invention that high-power high-voltage test devices of the class in question usually must be transported to the measurement object to be tested, which is not always simply possible for devices known from the prior art.

A present, mobile (VLF) high-power high-voltage test devices of the type mentioned in the introduction are available with means for generating a sinusoidal VLF test voltage with an amplitude of up to 200 kV (corresponding to approximately 141 kV rms voltage) and electrical output powers of up to approximately 8 kW.

Obviously the costs of (mobile) high-power high-voltage test devices of the class in question are determined definitively by the output power to be applied by the device in question, and so, in practice, high-voltage test devices of the type mentioned in the introduction are usually offered in various power classes, the operational capabilities of which—depending on the voltage amplitudes that can be generated with the test devices in question and on the associated available output power—are limited.

And, finally, it has been found, especially when a high output power must be made available in high-voltage test devices, that the necessary cooling of the high-voltage electronics is becoming increasingly problematic, especially for the components of the various voltage-amplifier branches disposed therein on the high-voltage side. This is the case in particular when the said devices must be transported as mobile test devices to the measurement object, which in the prior art is frequently implemented by providing a device structure that is as compact as possible.

SUMMARY

Against this background, it is the object of the present invention to improve a high-voltage high-power test device of the type mentioned in the introduction to the effect that, despite sufficiently high electrical output power, it can be adequately cooled in the simplest possible way and can be easily transported, wherein, in additional aspects of the invention and its preferred improvements, the capability is also created in particular to increase the output power deliverable with inventive high-voltage test devices as simply as possible.

This object is achieved in the scope of the present invention according to the claims by the fact that, in a high-power high-voltage test device of the class in question, each voltage-amplifier branch is mounted in a separate subassembly with integrated active air cooling.

By the fact that, in the present case, the high-voltage source, i.e. the means for generating the test voltage, is subdivided into at least two separate subassemblies each containing a voltage-amplifier branch, wherein a separate active air-cooling system is integrated into each subassembly, the particularly high cooling demand of a high-voltage test device of the class in question can be met in particularly simple manner. Thus each amplifier branch is actively cooled by its own air-cooling system in the subassembly in question.

In other respects, the inventive high-voltage test device can be transported particularly simply, since the separate subassemblies—respectively containing a voltage-amplifier branch—can also be advantageously transported separately to a given installation location and only there be connected appropriately to the unit under test or to one another or to further components (e.g. a central control unit) of the high-voltage test device, wherein it is particularly preferable that the separate subassemblies can be installed physically separated from one another.

Advantageously, each subassembly is configured in the manner of a separate or separately installable device with its own housing, wherein each subassembly, as will be explained in more detail hereinafter, may in turn also consist if necessary of (at least) two elements or housing portions connected detachably to one another.

Where it is mentioned in the present description that each of the separate subassemblies contains an integrated active air-cooling system, this is preferably an air-cooling system equipped with at least one fan, in which the elements of the respective voltage-amplifier branch to be cooled are cooled by a well-defined cooling-air stream, which is passed, for example, in suitable air-conveying ducts within a housing. Such an active air-cooling system can be supported if necessary by further cooling elements, such as, for example, by surface-enlarging cooling members in the cooling-air duct, actively cooling Peltier or PTC elements in regions with particularly high heat development, etc.

Inasmuch as the test voltage is generated in the scope of the present invention by using two voltage-amplifier branches, of which a first is used to generate the positive voltage half waves of the test voltage and a second to generate the negative voltage half waves of the test voltage, the basic design of (high) voltage amplifiers suitable for this purpose is known from the prior art.

As an example in this respect, DE 19513441 C5 relates to a circuit arrangement for generating a test voltage. Therein, by means of two amplifier branches functioning as high-voltage sources, each with a switched power pack, a high-voltage transformer, a rectifier circuit and an electronically regulable high-voltage switch arrangement connected downstream therefrom, a unit under test or measurement object is charged and discharged in well-defined manner by supplying a test voltage with pre-programmable variation. In this respect the first amplifier branch is used to supply the positive voltage half waves of the test voltage and the second amplifier branch to generate the negative voltage half waves of the test voltage, which, for example, may be sinusoidal and have the voltage amplitude and power claimed in the present invention.

Furthermore, from the publication "Discharge measurements in cables using a solid state 30 kV bipolar low frequency generator", S. J. Kearley, R. R. MacKinlay, Fifth International Conference on Dielectric Materials, Measurements and Applications, 1988, p. 171-174, for example, a switch arrangement is also known that can be operated without problems in the present power range with a voltage amplitude of at least 100 kV and in which a test voltage that can be regulated in its variation is generated for well-defined charging and discharging of a measurement object from a positive or negative d.c. voltage in the kV range by means of a suitable solid-state switch arrangement (functioning as a controllable current source). This it is also possible on the basis of this principle to achieve a first voltage-amplifier branch for generating the positive voltage half waves and a second voltage-amplifier branch for generating the negative voltage half waves of a test voltage.

Furthermore, within the scope of the present invention, it is also possible to use, for the respective voltage-amplifier branches, a switch arrangement that is set up for attachment to a line voltage, from which, by means of a switched power pack containing a modulator, the positive (or negative) voltage half waves of the line voltage are first modulated in a first step to an a.c. voltage with a high frequency of, for example, 70 kHz at, for example, 370 V absolute voltage amplitude and then, by means of a transformer connected downstream from the switched power pack, this is transformed to a voltage amplitude of, for example, 8 kV (while still retaining the 70 kHz frequency). From this it is then possible, by means of a suitable cascade circuit of capacitors and rectifiers, to generate a d.c. voltage of, for example, 200 kV, in which case it would already be possible if necessary to generate, with such a cascade circuit, by suitable switching or regulation, a high voltage of variable amplitude, in order to reduce or minimize subsequent switching losses. This cascade circuit may then follow, in the voltage-amplifier branch in question, a solid-state switch arrangement (disposed on the high-voltage side and subjected to electronic control and/or regulation), which, as described, for example, in the aforesaid publication of Kearly and MacKinlay, transforms the positive or negative high voltage generated by the upstream components of the voltage-amplifier branch to positive or negative voltage half waves with an absolute amplitude of approximately 200 kV and a frequency of, for example, 0.1 Hz, accompanied in particular by evaluation of the test current and/or of the test voltage measured on the measurement object. If necessary or advantageous, a circuit for damping of disturbances and therefore for smoothing of the desired output voltage may also be connected downstream from this solid-state switch arrangement. Obviously the voltage-amplifier branch supplying the positive voltage half waves and that supplying the negative voltage half waves can then be appropriately synchronized (e.g. by means of a synchronizing signal generated by a central control unit), so that the positive and negative voltage half waves generated in the various amplifier branches (by alternately applying the various voltage half waves to the measurement object) form the desired test voltage.

The measuring circuit of an inventive high-voltage test device that measures the test current and the test voltage may be configured in a way standard in the art, in which case, for example, the current flowing through the unit under test may also be measured if necessary within the respective amplifier branches, so that a part of the measuring circuit involved in measurement of the test current—and otherwise, if necessary, also a part of the measuring circuit involved in measuring the test voltage—may be integrated if necessary into the subassemblies containing the respective amplifier branches.

Within the scope of a first improvement of the present invention, it is provided that the test voltage generated by interaction of the voltage-amplifier branches mounted in separate subassemblies is a VLF (very low frequency) a.c. voltage with a frequency in the range between 0.01 Hz and 1 Hz. Such VLF test devices, which particularly preferably generate a test voltage with a frequency of 0.1 Hz, exhibit—because of the continuous supply of the test voltage and of the control or regulation interventions occurring continuously in the amplifier branches—a particularly high amount of waste heat, which can be removed particularly effectively in the scope of the present invention, namely separately for each amplifier branch. An evaluation unit of the device—for example, integrated in a central control unit of the high-voltage test device—can also be set up advantageously to determine the loss factor of the measurement object to be tested.

Furthermore, it is preferably provided in the scope of the present invention that the means for generating the test voltage has an even number n, where n≥4, of voltage-amplifier branches, wherein each voltage-amplifier branch is mounted in a separate subassembly with integrated active air cooling and wherein the high-voltage test device is set up with suitable synchronization of the voltage-amplifier branches in such a way that the first half (=n/2) of the voltage-amplifier branches for generation of the positive voltage half waves of the test voltage and the second half (=n/2) of the voltage-amplifier branches for generation of the negative voltage half waves of the test voltage work together.

By virtue of the implementation of individual voltage-amplifier branches in separate subassemblies, it is possible in particularly simple manner in the scope of the present invention to multiply the output power that can be supplied with two voltage-amplifier branches by using respectively an identical plurality (n/2, with n≥4) of—preferably identical—voltage-amplifier branches both for generation of the positive voltage half waves of the test voltage and for generation of the negative voltage half waves of the test voltage.

It is evident that the measurement object can then be attached in such a way that the respective voltage-amplifier branches apply the high-voltage generated by the respective voltage-amplifier branch to the measurement object in parallel circuitry, wherewith—depending on the number of voltage-amplifier branches being used—the electrical power of the high-voltage test device can obviously be multiplied (compared with the prior art). Since every amplifier branch in the present case is mounted in a separate subassembly with its own active air cooling, the power increase made possible according to the invention has no detrimental effects on the cooling concept of the inventive high-power high-voltage test device.

In other respects, it is possible according to the invention to realize a high-voltage test device of modular construction, by the fact that, according to a further preferred configuration of the present invention, it may be provided that the high-voltage test device is configured and set up in such a way that, up to a system-limited maximum number of voltage-amplifier branches, it is respectively possible to add to the means for generating the test voltage at least one further pair of voltage-amplifier branches, of which a first voltage-amplifier branch always contributes to generation of the positive voltage half waves of the test voltage and a second voltage-amplifier branch to generation of the negative voltage half waves of the test voltage.

In other words, it is therefore possible in the scope of the present invention to implement a device concept in which, for example, the high-voltage test device, in a first configuration, can first be operated with (exactly) one pair of voltage-amplifier branches (for generation of the positive and negative voltage half waves), wherein the test device can be expanded (and dismantled again) by simple addition or simple attachment of further pairs of voltage-amplifier branches (and thus a first voltage-amplifier branch for generation of the positive voltage half waves and a second voltage-amplifier branch for generation of the negative voltage half waves) for the purpose of increasing the output power. In this way the user of such devices is made capable of adapting an inventive high-voltage test device if necessary to the output power needed for a given measurement, by being able to install the device at the installation location simply with the number of amplifier branches needed for the purpose. In other respects, once again no impairments related to the transportability of the high-voltage test device and/or to problems with cooling the device occur under these circumstances. It is merely necessary to transport and install a number of subassemblies higher than the minimum number of two subassemblies (containing the respective amplifier branches). The system-limited largest number of voltage-amplifier branches that can be used at most in an inventive high-voltage test device may be, for example, n=6, 8, 10, 12, 14, 16, 18, 20, 22, 24 or even higher.

Assuming that electrical output powers of approximately 8 kW with a VLF test voltage having a voltage amplitude of 200 kV can already be achieved with the high-voltage test devices known from the prior art by using precisely one pair of voltage-amplifier branches, such an output power can be increased in simple manner in the scope of the present invention to 24-80 kW (with the same voltage amplitude because of the existing parallel circuitry) by using, for example, 3 to 10 pairs of voltage-amplifier branches (corresponding to n=6 to 20).

Furthermore, it proves to be of particular advantage when the high-voltage test device has a central control unit, which is also mounted in a separate subassembly and on which an even number of attachment elements is provided for attachment of the at least two subassemblies—each containing a voltage-amplifier branch.

Where the attachment of the subassemblies containing the voltage-amplifier branches to the central control unit is mentioned in the present description, this may be a mechanical and/or electrical attachment, wherein a first attachment element for establishment of a mechanical connection of the subassembly in question to the housing of the central control unit may also be provided respectively if necessary for attachment of each subassembly, as may a second attachment element for establishment of an electrical connection. For safety reasons, attention should then be paid advantageously to good mechanical coupling of the various subassemblies.

The establishment of an electrical connection between the subassemblies containing the individual amplifier branches and the central control unit is particularly necessary when—as is provided in yet another preferred improvement of the invention—an attachment element for attachment and for electrical contacting of the measurement object or unit under test is further provided on the subassembly containing the central control unit.

Furthermore, for the respective voltage-amplifier branches, it is advantageously possible to provide a communications line, which can be established by means of a suitable connection, between the central control unit and the respective subassembly or local control units integrated therein, via which synchronization of the various voltage-amplifier branches can be achieved, for example by means of a suitable synchronizing signal, and/or via which communication between local control units of the various voltage-amplifier branches and the central control unit can be achieved, for example in a bidirectional connection, in order that, for example by providing plug-and-play functionality, it is possible by means of the central control unit to detect automatically which and how many voltage-amplifier branches are working together in the context of generation of the test voltage. Furthermore, the individual subassemblies containing the voltage-amplifier branches may advantageously deliver the measured values of test current and/or test voltage that may have been determined in the subassembly in question to the central control unit for further evaluation. However, the communication between the various control units could also take place for example wirelessly (e.g. via W-LAN, Bluetooth or other radio transmission techniques), provided suitable communications modules are mounted in the participating subassemblies.

It is provided particularly preferably in the scope of the present invention that the subassembly containing the central control unit comprises a housing, which can be placed on a base and extends tower-like in vertical direction, on the lateral periphery of which, preferably in its upper end region, the at least two attachment elements are provided for attachment of the subassemblies containing one voltage-amplifier branch each. If, due to the nature of the system, a certain larger number of subassemblies that have voltage-amplifier branches integrated therein and that can be attached at most to the high-voltage test device is provided, the number of attachment elements provided on the subassembly containing the central control unit advantageously corresponds to this number, in which case it would also be possible if necessary to imagine, as an alternative, the provision of various adapter plates, with a corresponding number of attachment elements, matched to the respective specifically used number of voltage-amplifier branches.

Advantageously, the attachment elements in question are distributed uniformly over the periphery of the housing, in order to be able to guarantee a largest possible distance between the subassemblies to be attached to the individual attachment elements.

It is also conceivable, however, that the subassembly containing the central control unit and the subassemblies containing the respective voltage-amplifier branches can be installed completely separately and apart from one another and that contacting of the various elements of the high-voltage test device that may be necessary for operation of the high-voltage test device takes place exclusively via suitable connecting cables.

In yet another preferred improvement of the invention, the subassemblies containing the individual voltage-amplifier branches respectively have a first and second housing portion, wherein the first housing portion can be placed on a base and (just as the housing of the subassembly containing the central control unit) extends tower-like in vertical direction, and wherein the second housing portion, which advantageously extends in substantially (or exactly) horizontal direction, is fastened with a first end to the first housing portion, preferably in the upper end region thereof, and can be attached with a second end to the subassembly containing the central control unit. If necessary, these two housing portions may be connected detachably to one another, thus again simplifying their transportation.

The electronics constituting the respective voltage-amplifier branch may be distributed over the two housing portions, through both of which the cooling air transported by the active air-cooling system preferably flows.

For this purpose it may be advantageously provided that air-conveying ducts connected to one another are formed both in the first and in the second housing portion of the subassembly containing a voltage-amplifier branch, wherein an inlet opening for the cooling air is provided in the first housing portion, preferably near the bottom, and an outlet opening for the (heated) cooling air is provided in the second housing portion, preferably in its end region removed from the first housing portion.

This two-piece housing configuration with one vertically and one horizontally oriented housing portion ensures that the fresh cooling air can enter the housing sufficiently far removed from the outlet opening for the heated cooling air, where in thermodynamically favorable manner it is first conveyed upward and finally is deflected for the purpose of passage through the horizontal housing portion.

Under these circumstances it proves particularly advantageous if the cooling air is sucked in by means of a fan in the region of the inlet opening provided in the first housing portion.

Since it may be provided in an inventive high-voltage test device that it also is possible to dispose, in the second housing portion—which is oriented horizontally and advantageously at a distance from the base—of the subassemblies containing the voltage-amplifier branches, especially (high-voltage) electronic components that require particularly effective cooling, it has proved extremely expedient in the scope of the present invention, as regards optimization of the cooling capacity of the air-cooling system integrated in the respective subassembly, for the control unit controlling at least one fan or a control unit controlling at least one fan to be set up to bring about, as needed or at pre-programmable time intervals, reversal of the air stream being conveyed for cooling purposes through the subassembly.

And, finally, it is advantageously provided in the scope of the present invention that the measuring circuit is disposed at least partly in the subassembly containing the central control unit. For this purpose it is possible in particular to use a voltage divider, with which—inside the subassembly forming the central control unit—the test voltage applied to the measurement object is measured.

BRIEF DESCRIPTION OF THE DRAWINGS

An exemplary embodiment of the invention will be explained in more detail hereinafter on the basis of the drawing, wherein.

DETAILED DESCRIPTION OF THE PREFERRED EMBODIMENTS

Figure 1:
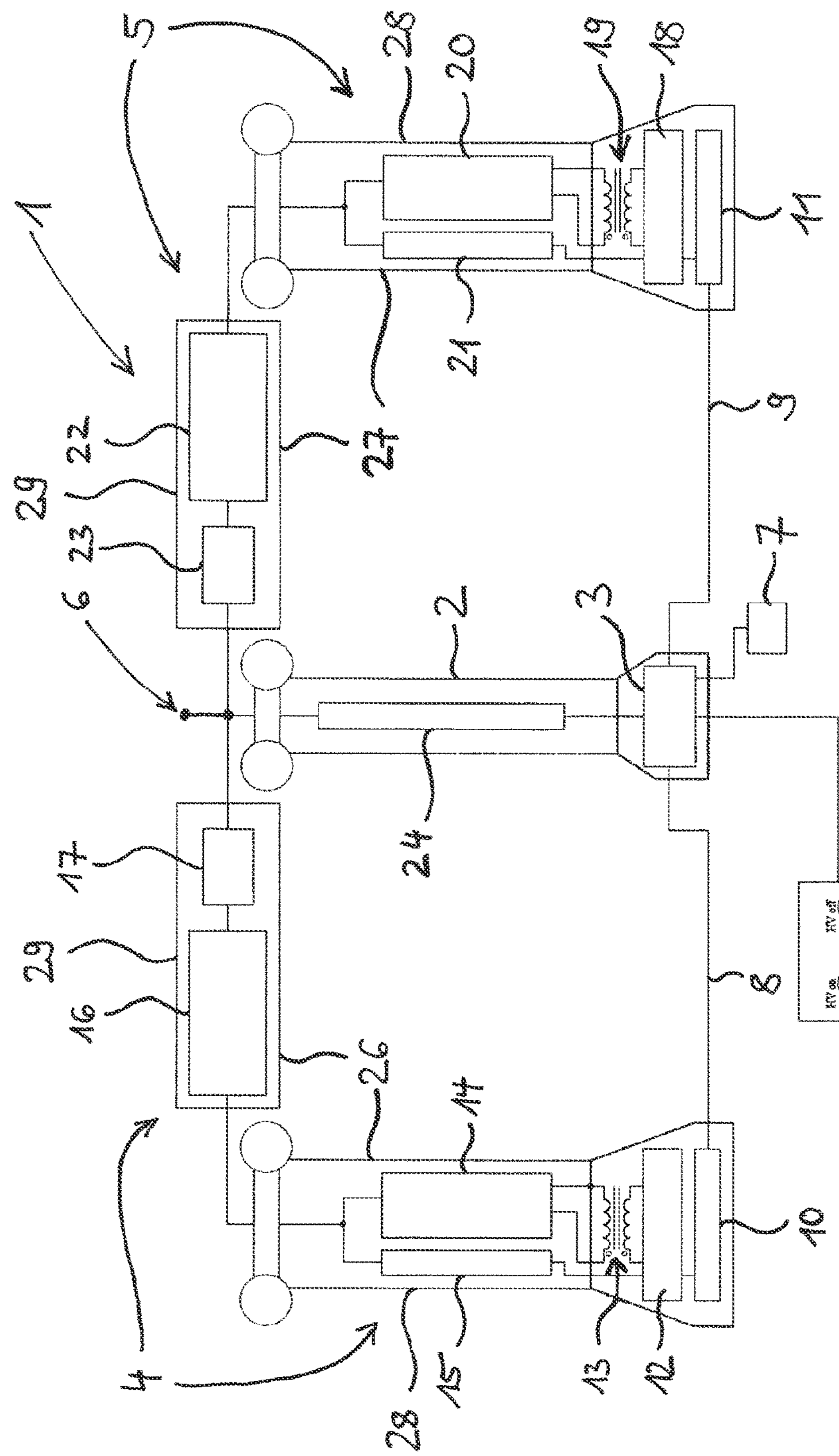
FIG. 1 shows a schematic diagram of an exemplary embodiment of an inventive high-power high-voltage test device with two voltage-amplifier branches.

FIG. 1 shows, in a schematic diagram, an inventive high-voltage test device 1, which has a central control unit 3 mounted in a separate subassembly 2.

The means for generating the test voltage (a.c. voltage with an absolute amplitude of at least 100 kV at a power of higher than 1 kW) are formed by (at least) two voltage-amplifier branches 4, 5, of which voltage-amplifier branch 4 shown at the left in FIG. 1 is used for generation of the positive voltage half waves of the test voltage and voltage-amplifier branch 5 shown at the right in FIG. 1 is used for generation of the negative voltage half waves of the test voltage.

The test voltage itself is then applied to an attachment 6 for a measurement object to be tested (e.g. a high-voltage cable, not shown), wherein attachment 6 in the present case is formed on subassembly 2 containing central control unit 3. Via attachment 6, the (positive and negative) voltage half waves supplied by the two voltage-amplifier branches 4, 5 are applied in alternation to the measurement object to be tested, so that in total an a.c. voltage (which is sinusoidal, for example), which preferably is a VLF (very low frequency) voltage in the frequency range between 0.01 Hz and 1 Hz, is supplied at output 6 as the test voltage for testing the measurement object.

Furthermore, an attachment for an external power supply line 7 is provided on subassembly 2 containing central control unit 3, wherein the line voltage is supplied to voltage-amplifier branches 4, 5 using suitable conductors 8, 9.

Central control unit 3 of high-voltage test device 1 is in preferably bidirectional communication with local control units 10, 11 of the various voltage-amplifier branches 4, 5, especially in order to synchronize the voltage half waves of the test voltage to be generated with the various voltage-amplifier branches 4, 5 with one another by transmitting suitable synchronizing signals, in which case the communication in question may be achieved wirelessly if necessary. Local control units 10, 11 are used in particular for control and/or regulation of the components mounted in the respective voltage-amplifier branch 4, 5.

In voltage-amplifier branch 4 shown at the left in FIG. 1, the positive voltage half waves of the line voltage (e.g. 230 V at 60 Hz) are first transformed, by means of a switched power pack 12 containing a modulator and a suitably set-up transformer 13, to an a.c. voltage of positive sign and high frequency compared with the frequency of the line voltage, in the present case with an amplitude of approximately 370 V and a frequency of 70 kHz. A cascade circuit 14. which is connected downstream from transformer 13 and which in standard design may consist of rectifiers and capacitors, transforms the a.c. voltage supplied on the output side of transformer 13 to a d.c. voltage of constant amplitude, in the present case +200 kV, wherein the amplitude of the high voltage present at the output side can be tapped by means of a voltage divider 15 connected in parallel with cascade circuit 14 and can be measured, for example, by means of a measuring device contained in local control unit 10. Hereby it is possible, by suitable control or regulation, to adjust or regulate the high voltage supplied on the output side of cascade circuit 14, even with variable amplitude if necessary, in order to reduce the heat-generating switching losses in high-voltage switch arrangement 16 connected downstream from amplifier branch 4 of cascade circuit 14. By means of a high-voltage switch arrangement 16 connected downstream from cascade circuit 14, the high voltage supplied on the output side of cascade circuit 14 is then transformed in voltage-amplifier branch 4 in such a way to positive voltage half waves of an a.c. voltage with amplitudes of at least 100 kV that ultimately the—time-shifted—positive voltage half waves of the test voltage are supplied by means of voltage-amplifier branch 4. In the present exemplary embodiment, a current-measuring device 17 is also connected downstream from high-voltage switch arrangement 16, wherein the current determined therewith obviously flows through the measurement object—which is attached to attachment 6 of subassembly 2 containing central control unit 3—and thus corresponds to the test current (induced by voltage-amplifier branch 4 shown at the left) in the measurement object. If necessary, a circuit (not shown) for damping or eliminating disturbances, i.e. for smoothing the voltage half waves generated in voltage-amplifier branch 4, could also be connected downstream from high-voltage switch arrangement 16.

Voltage-amplifier branch 5 shown at the right in FIG. 1, with which the negative voltage half waves of the test voltage are supplied for high-voltage testing of a measurement object, is designed in substantially the same way as voltage-amplifier branch 4 shown at the left in FIG. 1. In an analogous arrangement it also has a local control unit 11, a switched power pack 18 containing a modulator, a transformer 19, a cascade circuit 20 with voltage divider 21 connected in parallel therewith for measuring the high voltage supplied at the output side of cascade circuit 20, a high-voltage switch arrangement 22 and a current-measuring device 23.

The difference between the two voltage-amplifier branches 4, 5 is that negative voltage half waves of the test voltage, phase-shifted by 180°, are generated by voltage-amplifier branch 5 shown at the right in FIG. 1, so that on the whole—by alternating application of the positive and negative voltage half waves generated in the various voltage-amplifier branches 4, 5 to the measurement object attached at attachment 6—the desired test voltage is supplied. In this process it may be ensured by appropriate switching of high-voltage switches (not illustrated)—integrated into high-voltage switch arrangements 16, 22 of the respective voltage-amplifier branches 4, 5—that, for example, the measurement object is connected exclusively to the voltage-amplifier branch (or branches) in question for the duration of the positive or negative voltage half wave of the test voltage.

Obviously it is advantageous if current-measuring devices 17, 23 are set up to communicate the measured data obtained during the current measurement to the local control unit of the respective voltage-amplifier branch and/or to central control unit 3 of high-voltage test device 1.

Finally, in subassembly 2 containing central control unit 3 and equipped with the attachment for the measurement object, a device 24 (containing a voltage divider) for measuring the test voltage applied to the measurement object is also provided. In the present case, therefore, the measuring circuit for measuring the test voltage at the measurement object (to be attached at attachment 6) is distributed over the various voltage-amplifier branches 4, 5 and subassembly 2 containing central control unit 3.

And, finally, there is also attached, to central control unit 3, an operator-control module 24, which is constituted, for example, by a computer with suitable software and with which the high-voltage generation can be turned on and off and if necessary further settings (e.g. for the desired curve shape and/or frequency of the test voltage) can be made, and if necessary the measured results of current-measuring devices 17, 23 and of current-measuring device 24 can be read out. For this purpose, the said operator-control module 24 may be attached as shown to the central control unit or if necessary may also communicate wirelessly with the central control unit. Furthermore, in the scope of testing of a measurement object by means of central control unit 3 or operator-control module 14, it may also be advantageous to undertake further evaluations, especially the determination of the loss factor of a measurement object, and to output, save and/or forward the data determined in the process.

The schematic diagram of FIG. 1 already makes it evident that the two voltage-amplifier branches 4, 5 are respectively mounted in separate subassemblies 26, 27 (to be connected appropriately with one another at the installation location), wherein each subassembly 26, 27 has one vertically oriented and one horizontally oriented housing portion 28, 29, which will be explained in more detail hereinafter on the basis of FIG. 2. Each subassembly 26, 27—each containing a voltage-amplifier branch 4, 5—is additionally equipped with an active air-cooling system, which is integrated in the housing thereof or in housing portions 28, 29 of subassembly 26, 27 in question, as is explained hereinafter on the basis of FIG. 3.

Figure 2:
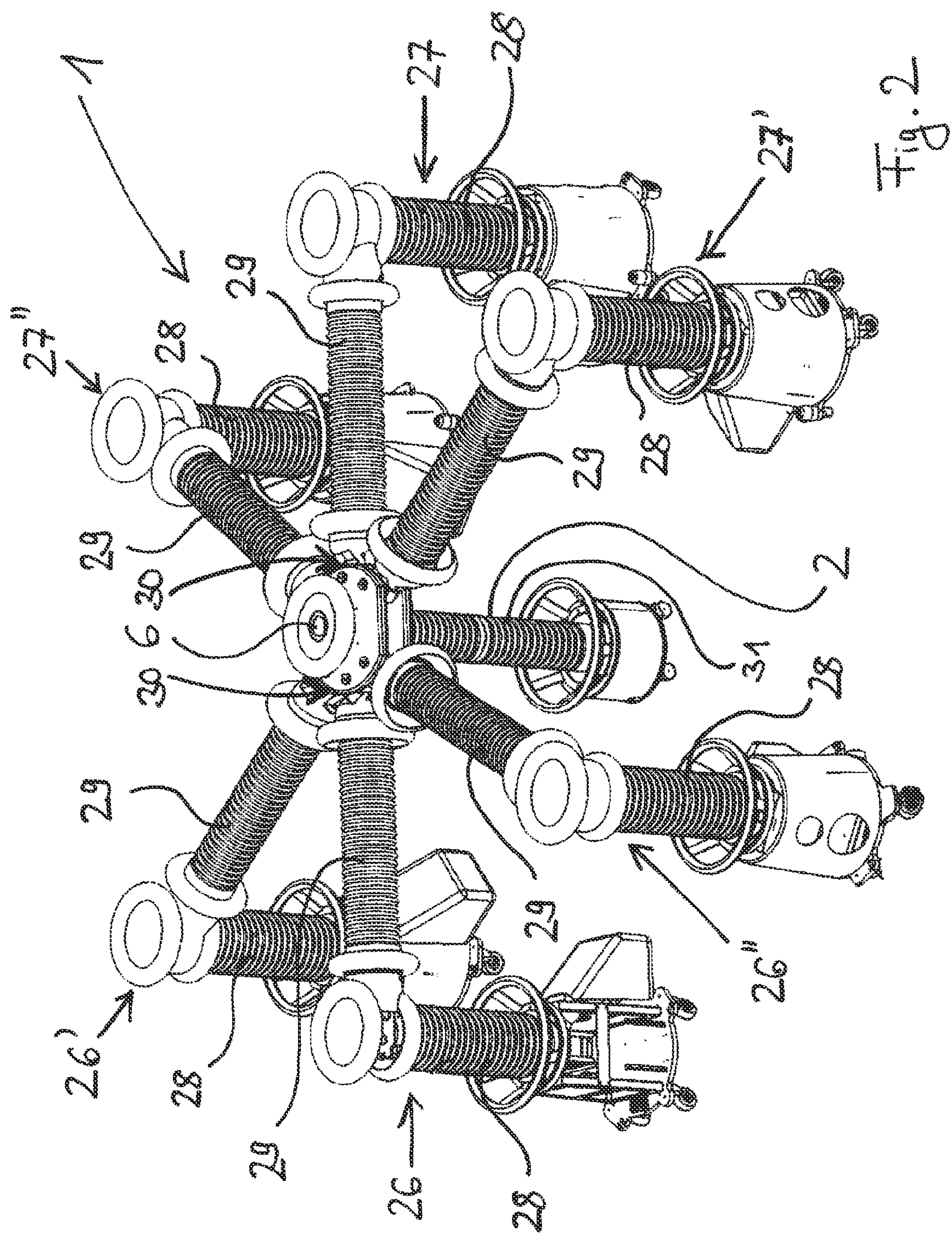
FIG. 2 shows a perspective view of an exemplary embodiment of an inventive high-power high-voltage test device.

FIG. 2 shows an exemplary embodiment of an inventive high-power high-voltage test device 1 in perspective view. This has a centrally disposed subassembly 2, in which the central control unit of the high-voltage test device is mounted and which has an attachment 6 for the measurement object to be tested with inventive high-voltage test device 1. Furthermore, in the present case, high-voltage test device 1 has in total six separate subassemblies 26, 26', 26", 27, 27', 27", which are attached via suitable attachment elements 30 to subassembly 2 containing central control unit 3.

In this arrangement, the three subassemblies 26, 26', 26" shown at the left in FIG. 2 each contain a voltage-amplifier branch for generation of the positive voltage half waves of the test voltage in correspondence with voltage-amplifier branch 4 shown at the left in FIG. 1 and the three subassemblies 27, 27', 27" shown at the right in FIG. 2 each contain a voltage-amplifier branch for generation of the negative voltage half waves of the test voltage in correspondence with voltage-amplifier branch 5 shown at the right in FIG. 1.

The voltage-amplifier branches—to be synchronized appropriately during high-voltage generation—in the various subassemblies 26, 26', 26", 27, 27', 27" and attachment 6 provided for the measurement object on central subassembly 2 are connected in parallel, and so the respective positive or negative voltage half waves of the voltage-amplifier branches generating the test voltage are always applied simultaneously to the measurement object, so that their respective output power, which preferably is at least respectively paired or on the whole is identical, is added up.

High-voltage test device 1 shown in FIG. 2 is already functional upon attachment of a first pair of voltage-amplifier branches (e.g. by suitable attachment of subassemblies 26, 27 to central subassembly 2) and if the need arises can be successively expanded by a further pair of voltage-amplifier branches (by attachment of subassemblies 26'/27' and 26"/27" respectively) for the purpose of each increase in the output power. In the present case, the system-limited maximum number of voltage-amplifier branches is n=6 (corresponding to attachment elements 30 provided on the central subassembly), although in other exemplary embodiments of inventive high-voltage test devices 1 it is possible if necessary to attach a much larger number of voltage-amplifier branches.

Subassembly 2 containing the central control unit comprises a housing 31, which can be placed on a base and extends tower-like in vertical direction, at the lateral periphery of which, in the present case in its upper end region, the six attachment elements 30 for attachment of subassemblies 26, 26', 26", 27, 27', 27", each containing a voltage-amplifier branch, are provided. These attachment elements are used in the present case for establishment of a good mechanical linkage of subassemblies 26, 26', 26", 27, 27', 27" to central subassembly 2. The electrical connection that may also be necessary, of components mounted in the respective subassemblies 2, 26, 26', 26", 27, 27', 27", can be achieved if necessary via separate cables (not shown), or in appropriate configurations of attachment elements 30 on central subassembly 2 (and the attachment elements corresponding thereto on subassemblies 26, 26', 26", 27, 27', 27") can be achieved simultaneously with the mechanical connection of the subassemblies.

The housings of all subassemblies 26, 26', 26", 27, 27', 27" containing the voltage-amplifier branches respectively have a first and second housing portion 28, 29. First housing portion 28 can be placed on a base and extends tower-like in vertical direction. Second housing portion 29, which extends in substantially horizontal direction, is fastened with a first end to first housing portion 28, namely in the upper end region thereof, and with a second end can be attached to subassembly 2 containing the central control unit.

Figure 3:
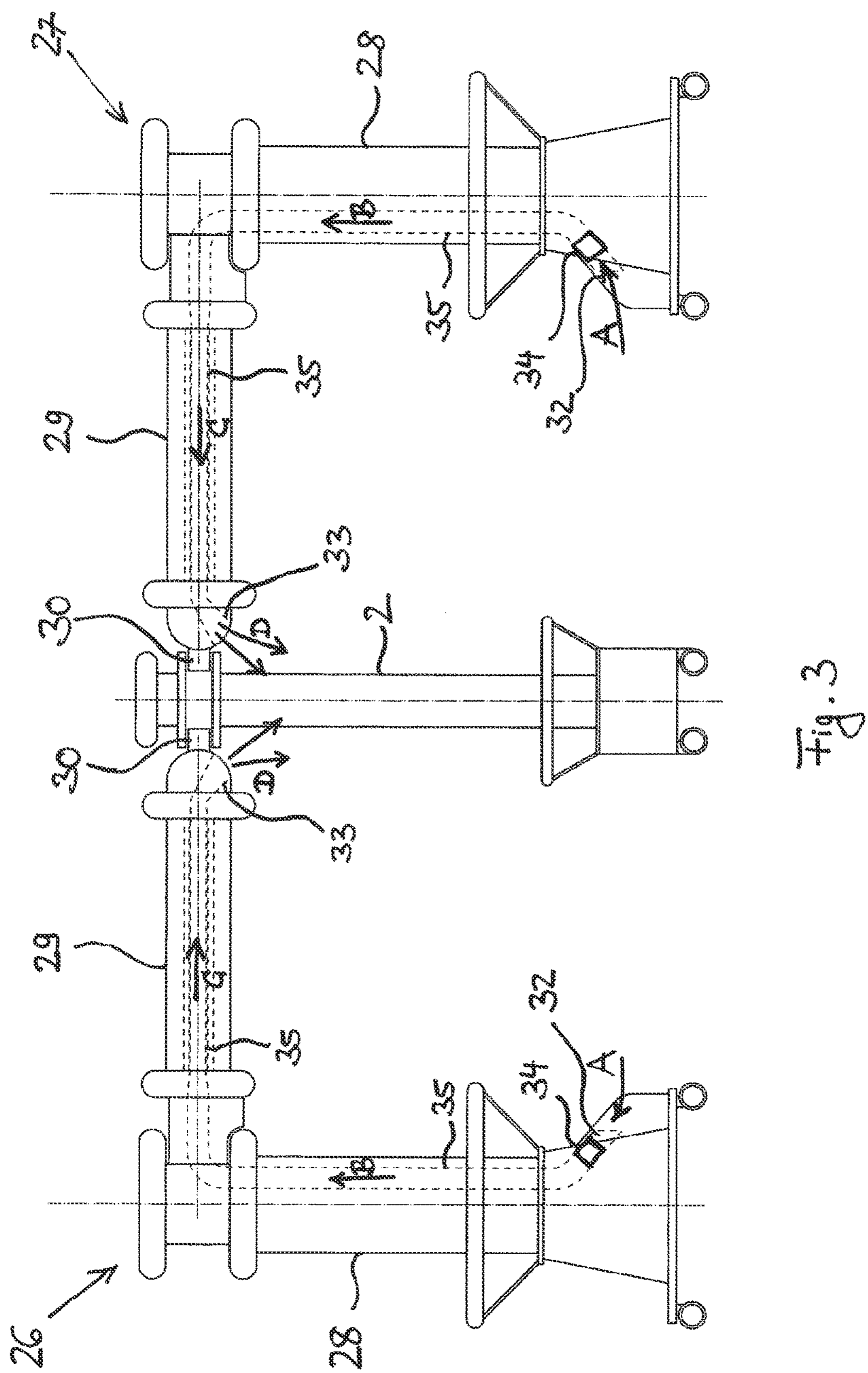
FIG. 3 shows a further diagram for illustration of the active air-cooling system of the subassemblies containing the voltage-amplifier branches.

FIG. 3 shows, in a schematic view, an example of the configuration of the active air-cooling system that is possible in the scope of the present invention. Therein each subassembly 26, 27 containing a voltage-amplifier branch is provided in its first housing portion 28 with an inlet opening 32 disposed close to the bottom for the cooling air and, in its second housing portion 29, namely in its end region removed from first housing portion 28, with an outlet opening 33 for the cooling air that has been heated during passage through the housing. The fresh cooling air is sucked in by means of a fan 34 according to arrow A and is passed in suitable cooling-air ducts 35 through the two housing portions 28, 29 according to arrows B, C, before it exits subassembly 26, 27 in question in the region of outlet opening 33 according to arrow D. Cooling-air ducts 35 adjoin the components of the voltage-amplifier branches to be cooled or are bounded by them. The air-cooling system is configured in such a way that reversal of the air stream can be brought about at least for a short time if the need arises.

What is claimed is:

1. A high-power high-voltage test device comprising:

means for generating a test voltage, wherein the test voltage is an a.c. voltage with an amplitude of at least 100 kV and a power of higher than 1 kW and wherein the means for generating the test voltage comprise at least two voltage-amplifier branches, a first voltage-amplifier branch for generating the positive voltage half-waves of the test voltage and a second voltage-amplifier branch for generating the negative voltage half-waves of the test voltage, and a measuring circuit for measuring the test voltage to be applied to a measurement object and the test current induced thereby in the measurement object, wherein each of the first and second voltage-amplifier branches is mounted in a separate subassembly, each branch provided with a separate integrated active air cooling.

2. The high-voltage test device of claim 1, wherein the test voltage generated by interaction of the voltage-amplifier branches mounted in separate subassemblies is a VLF (very low frequency) a.c. voltage with a frequency in the range between 0.01 Hz and 1 Hz.

3. The high-voltage test device of claim 1, wherein the means for generating the test voltage has an even number n, where n≥4, of voltage-amplifier branches, wherein each voltage-amplifier branch is mounted in a separate subassembly with integrated active air cooling and wherein the high-voltage test device is set up with suitable synchronization of the voltage-amplifier branches in such a way that the first half (=n/2) of the voltage-amplifier branches for generation of the positive voltage half waves of the test voltage and the second half (=n/2) of the voltage-amplifier branches for generation of the negative voltage half waves of the test voltage work together.

4. The high-voltage test device of claim 1, wherein the high-voltage test device is configured and set up in such a way that, up to a system-limited maximum number of voltage-amplifier branches, it is respectively possible to add to the means for generating the test voltage at least one further pair of voltage-amplifier branches, of which a first voltage-amplifier branch contributes to generation of the positive voltage half waves of the test voltage and a second voltage-amplifier branch to generation of the negative voltage half waves of the test voltage.

5. The high-voltage test device of claim 1, wherein the high-voltage test device has a central control unit, mounted in a separate subassembly and onto which an even number of attachment elements is provided for attachment of the at least two subassemblies, each containing a voltage-amplifier branch.

6. The high-voltage test device of claim 5, wherein an attachment element for attachment and for electrical contacting of the measurement object is further provided on the subassembly containing the central control unit.

7. The high-voltage test device of claim 5, wherein the subassembly containing the central control unit comprises a housing that extends tower-like in vertical direction, on the lateral periphery of which, preferably in its upper end region, the at least two attachment elements are provided for attachment of the subassemblies containing one voltage-amplifier branch each.

8. The high-voltage test device of claim 5, wherein the subassemblies containing the individual voltage-amplifier branches respectively have a first and second housing portion, wherein the first housing portion extends tower-like in vertical direction, and wherein the second housing portion, which extends in substantially horizontal direction, is fastened with a first end to the first housing portion, preferably in the upper end region thereof, and can be attached with a second end to the subassembly containing the central control unit.

9. The high-voltage test device of claim 8, wherein air-conveying ducts connected to one another are formed in the first and in the second housing portion of the subassembly containing a voltage-amplifier branch, wherein an inlet opening for the cooling air is provided in the first housing portion, preferably near the bottom, and an outlet opening for the cooling air is provided in the second housing portion, preferably in its end region removed from the first housing portion.

10. The high-voltage test device of claim 9, wherein the cooling air is sucked in by means of a fan in the region of the inlet opening provided in the first housing portion.

11. The high-voltage test device of claim 10, wherein the control unit controlling at least one fan or a control unit controlling at least one fan (34) is set up to bring about, as needed or at pre-programmable time intervals, reversal of the air stream being conveyed for cooling purposes through the subassembly.

12. The high-voltage test device of claim 5, wherein the measuring circuit is disposed at least partly in the subassembly containing the central control unit.

* * * * *